(12) United States Patent
Chu

(10) Patent No.: US 6,734,078 B2
(45) Date of Patent: May 11, 2004

(54) PROCESS FOR MANUFACTURING SEMICONDUCTORS WITH A TRENCH CAPACITOR

(75) Inventor: Shu-Ching Chu, Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 70 days.

(21) Appl. No.: 10/061,425

(22) Filed: Feb. 1, 2002

(65) Prior Publication Data

US 2003/0082885 A1 May 1, 2003

(30) Foreign Application Priority Data

Oct. 29, 2001 (TW) .......................... 90126698 A

(51) Int. Cl.⁷ ............................................ H01L 21/20
(52) U.S. Cl. ...................................................... 438/389
(58) Field of Search ................................ 438/239, 243, 438/246, 248, 301, 381, 389, 386; 257/296, 301

(56) References Cited

U.S. PATENT DOCUMENTS 6,372,573 B2 * 4/2002 Aoki et al. ................. 438/248

* cited by examiner

Primary Examiner—David A. Zarneke
Assistant Examiner—Monica D. Harrison
(74) Attorney, Agent, or Firm—Ladas & Parry

(57) ABSTRACT

The present invention provides a method for manufacturing semiconductors with trench capacitors having a low-resistance buried strap, comprising providing a substrate, forming a trench in the substrate, forming a glass doping layer with a first predetermined depth at the bottom of the trench, wherein the glass doping layer is doped with an n-type dopant, forming a first dielectric layer covering the glass doping layer in the trench, diffusing the n-type dopant of the glass doping layer to the substrate by annealing to form a buried plate, removing the first dielectric layer and the glass doping layer, sequentially forming a second dielectric layer and a first conductive layer having depths approximately equal to the first predetermined depth in the trench, wherein the region above the first conductive region is defined as the collar region, forming a U-shaped insulating layer in the collar region, forming a collar conductive layer at the bottom of the U-shaped insulation layer in the collar region, removing the U-shaped insulating layer not in contact with the collar conductive layer to form a collar insulating layer, and forming the buried strap in the trench.

12 Claims, 8 Drawing Sheets

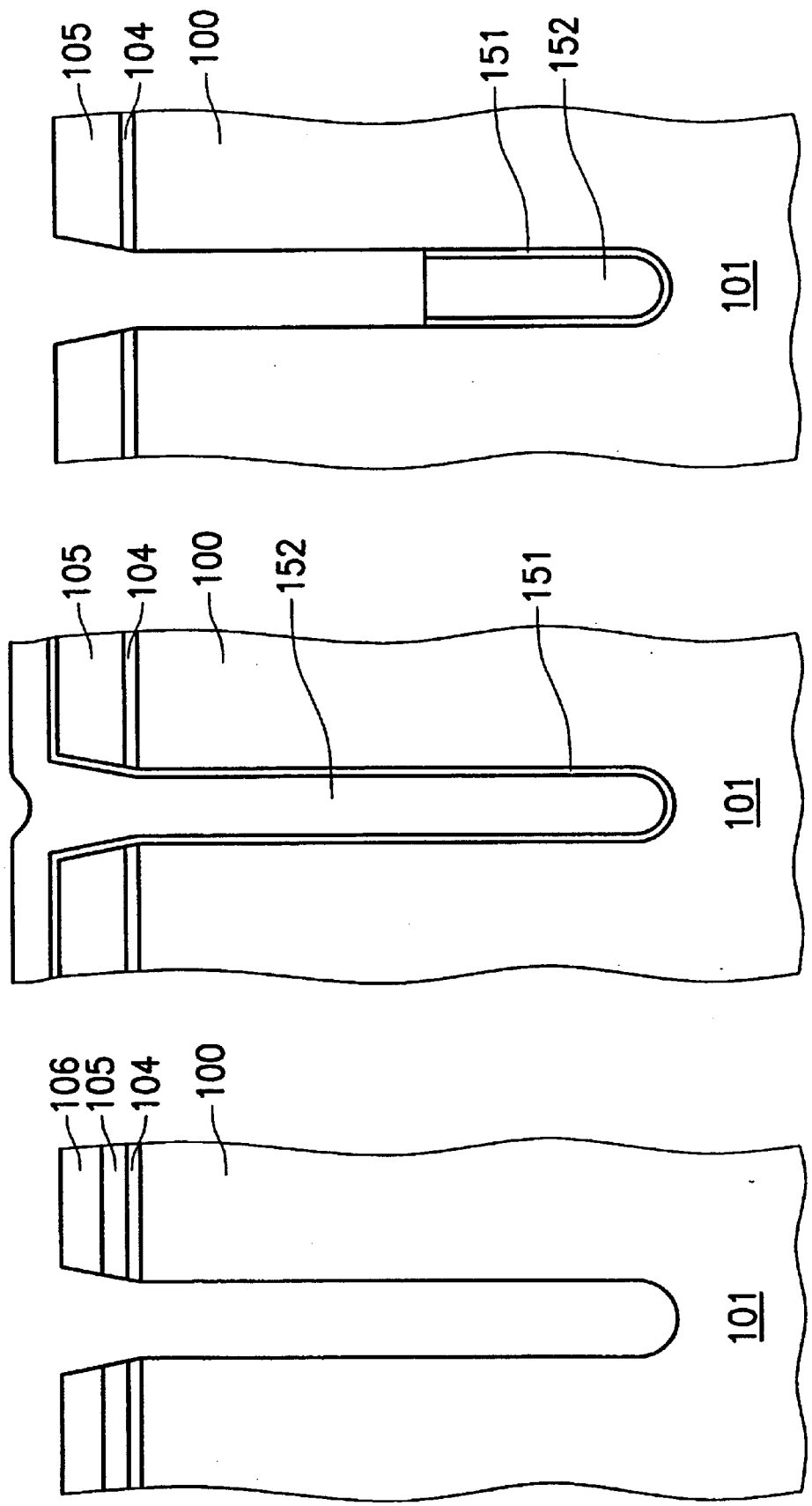

PROCESS FOR MANUFACTURING SEMICONDUCTORS WITH A TRENCH CAPACITOR

BACKGROUND OF THE INVENTION

1. Field of the Invention

The present invention relates in general to a method for manufacturing semiconductors with a trench capacitor. In particular, the method prevents gaps between the conductive layers of the trench capacitor to form a trench capacitor with good conductivity.

2. Description of the Related Art

FIG. 1A shows a trench having a predetermined depth formed in a predetermined location on a semiconductor substrate. The trench 10 of a predetermined depth is formed in a semiconductor substrate 1, such as silicon semiconductor, using a photo mask 2. FIG. 1B shows a fiberglass film 11 of an n+ type doping at the bottom of the trench 10. The fiberglass film 11 is typically formed with doped arsenic (As), thus briefed as ASG. After annealing. As is diffused into the semiconductor substrate 1 to form a buried plate 12 as the region enclosed by the dotted line in FIG. 1C. The fiberglass film 11 is removed after the buried plate 12 is formed. Next, as shown in FIG. 1D, a dielectric layer 13 is formed at the bottom of the trench 10. In FIG. 1E, a heavily doped first polysilicon layer 14 is formed at the bottom region of the trench. The first polysilicon layer 14, the dielectric layer 13 and the buried plate 12 form a trench capacitor with the first polysilicon layer 14 and the buried plate 12 being the electrodes. An insulating layer is deposited at the upper part of the trench 10 to form a collar insulating layer 15 after dry etching, exposing the first polysilicon layer 14 as shown in FIG. 1F. The collar insulating layer 15 is a sidewall gradually thinning at the top as a result of etching. The collar insulating layer 15 can be formed with Tetra Ethyl Oxysilane. A second polysilicon layer 16 is then formed at the upper part of the trench 10 as shown in FIG. 1G. The second polysilicon layer 16 is in contact with the first polysilicon layer 14 and lower than the depth of the trench 10. The collar 16 on the sidewall is wet etched to form a diffusion indentation 17; whereupon the diffusion indentation is narrows from the bottom up as shown in FIG. 1H. Finally, a buried strap 18 is formed in the trench 10 as shown in FIG. 1I and the trench capacitor is formed in the semiconductor accordingly.

As semiconductor technology advances into sub-micron technologies, the electrical connection between the conductive layers is sometimes incomplete. As shown in FIG. 2, the collar insulating layer 15 formed by wet etching in the trench 10 is not always perpendicular to the first polysilicon layer 14. Therefore, the formation of the buried strap 18 in the trench 10 causes some gaps 19 to form in the diffusion indentation 17. The dopant in the first polysilicon layer 14 penetrates to the semiconductor substrate 1 through the second polysilicon layer 16 and the buried strap 18 of the diffusion indentation 17 to form a capacitor connection diffusion 20 with other components, such as transistors. However, if the buried strap 18 does not fill the diffusion indentation 17 up thoroughly causing some gaps 19 to be generated, the dopant in the first polysilicon layer 14 cannot diffuse to the semiconductor substrate 1 causing an increase in the resistance and a decrease in the yield.

SUMMARY OF THE INVENTION

An object of the present invention is to provide a semiconductor with a trench capacitor with good electrical connection between the conductive layers. The semiconductor comprises a buried plate formed on the U-shaped sidewall of the trench capacitor, a U-shaped dielectric layer formed in a lower region of the trench capacitor, a first conductive layer formed on the dielectric layer in the lower region, a collar insulating layer having a predetermined depth formed on the sidewall of a collar region of the trench capacitor, a second conductive layer having a predetermined depth formed on the collar insulating layer, and a buried strap formed on the first conductive layer, in contact with the sidewall of the trench capacitor, the collar insulating layer and the collar conductive layer.

Another object of the present invention is to provide a method for manufacturing semiconductors with trench capacitors having a low-resistance buried strap. The method comprises the steps of providing a substrate, forming a trench in the substrate, forming a glass doping layer with a first predetermined depth at the bottom of the trench, wherein the glass doping layer is doped with an n-type dopant, forming a first dielectric layer covering the glass doping layer in the trench, diffusing the n-type dopant of the glass doping layer to the substrate by annealing to form a buried plate, removing the first dielectric layer and the glass doping layer, sequentially forming a second dielectric layer and a first conductive layer having depths approximately equal to the first predetermined depth in the trench, wherein the region above the first conductive region is defined as the collar region, forming a U-shaped insulating layer in the collar region, forming a collar conductive layer at the bottom of the U-shaped insulation layer in the collar region, removing the U-shaped insulating layer not in contact with the collar conductive layer to form a collar insulating layer, and forming the buried strap in the trench.

One feature of the present invention lies in the provision of the collar insulating layer on the sidewall of the collar region in the trench capacitor.

Another feature of the present invention lies in the electrical connection between the buried strap and the first conductive layer in the collar region of the trench capacitor.

Yet another feature of the present invention is the formation of the trench capacitor in the substrate of the semiconductor memory.

The other feature of the present invention is the collar insulating layer being equal to or lower than the collar conductive layer.

With the formation of the diffusion indentation of a suitable shape, no gap is formed from the deposition of the buried strap in the diffusion indentation.

BRIEF DESCRIPTION OF THE DRAWINGS

The present invention can be more fully understood by reading the subsequent detailed description in conjunction with the examples and references made to the accompanying drawings, wherein:

FIGS. 3A–3I show the embodiment of the process for manufacturing semiconductors having trench capacitors in the present invention.

DETAILED DESCRIPTION OF THE PREFERRED EMBODIMENTS

Figures 1A, 1B, 1C:
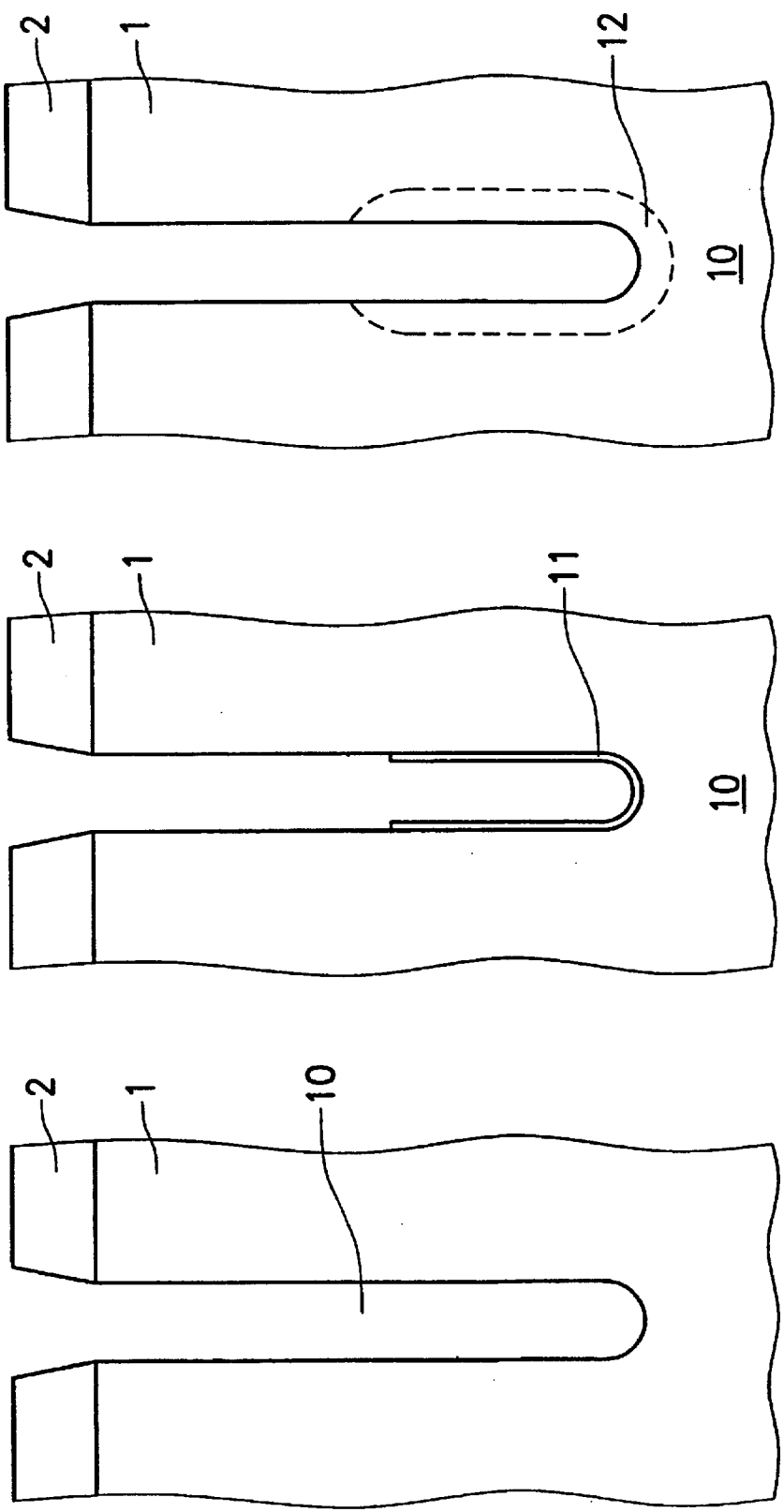
FIGS. 1A–1I show the conventional process for manufacturing semiconductors having trench capacitors.
Figures 1D, 1E, 1F:
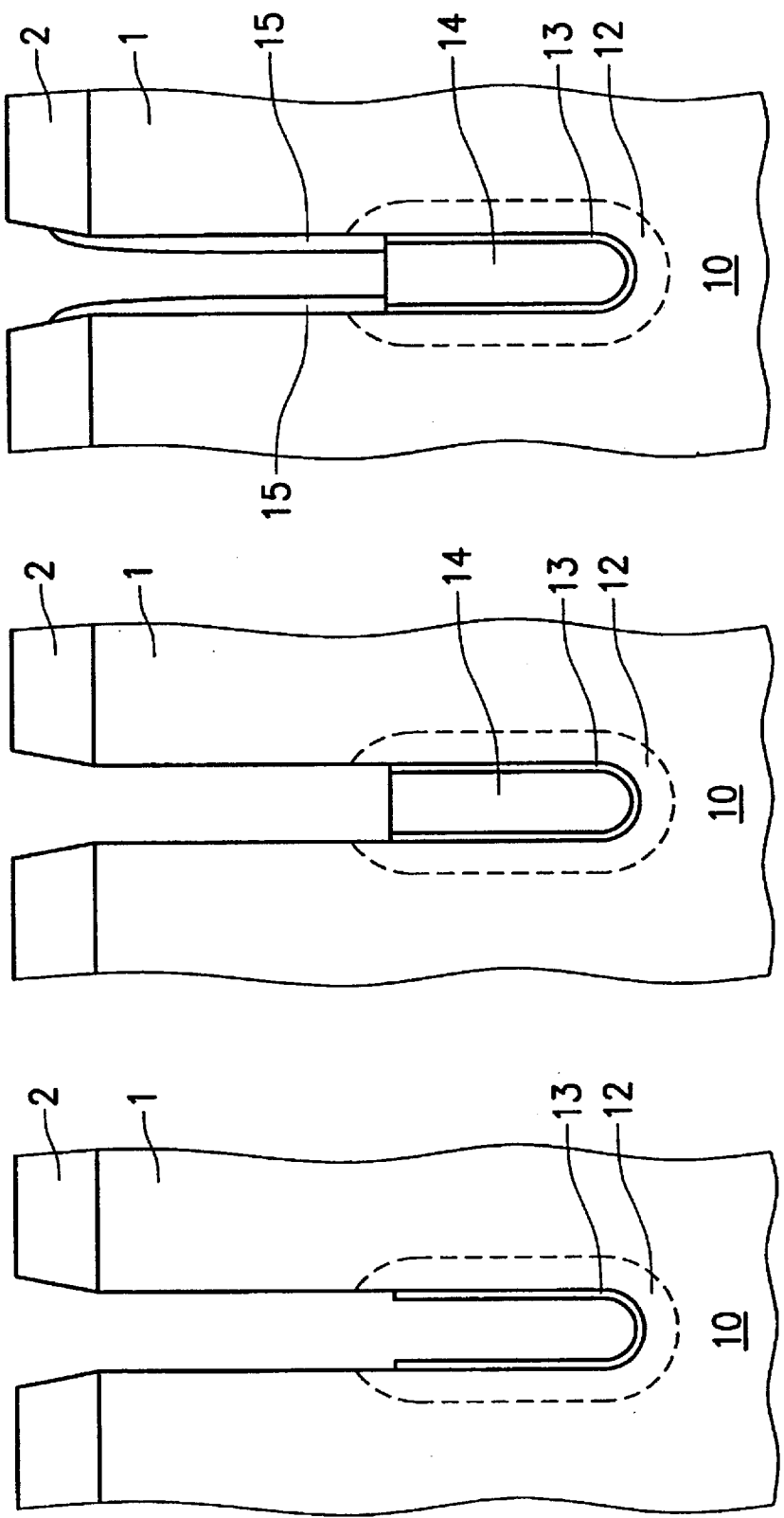
Figures 1G, 1H, 1I:
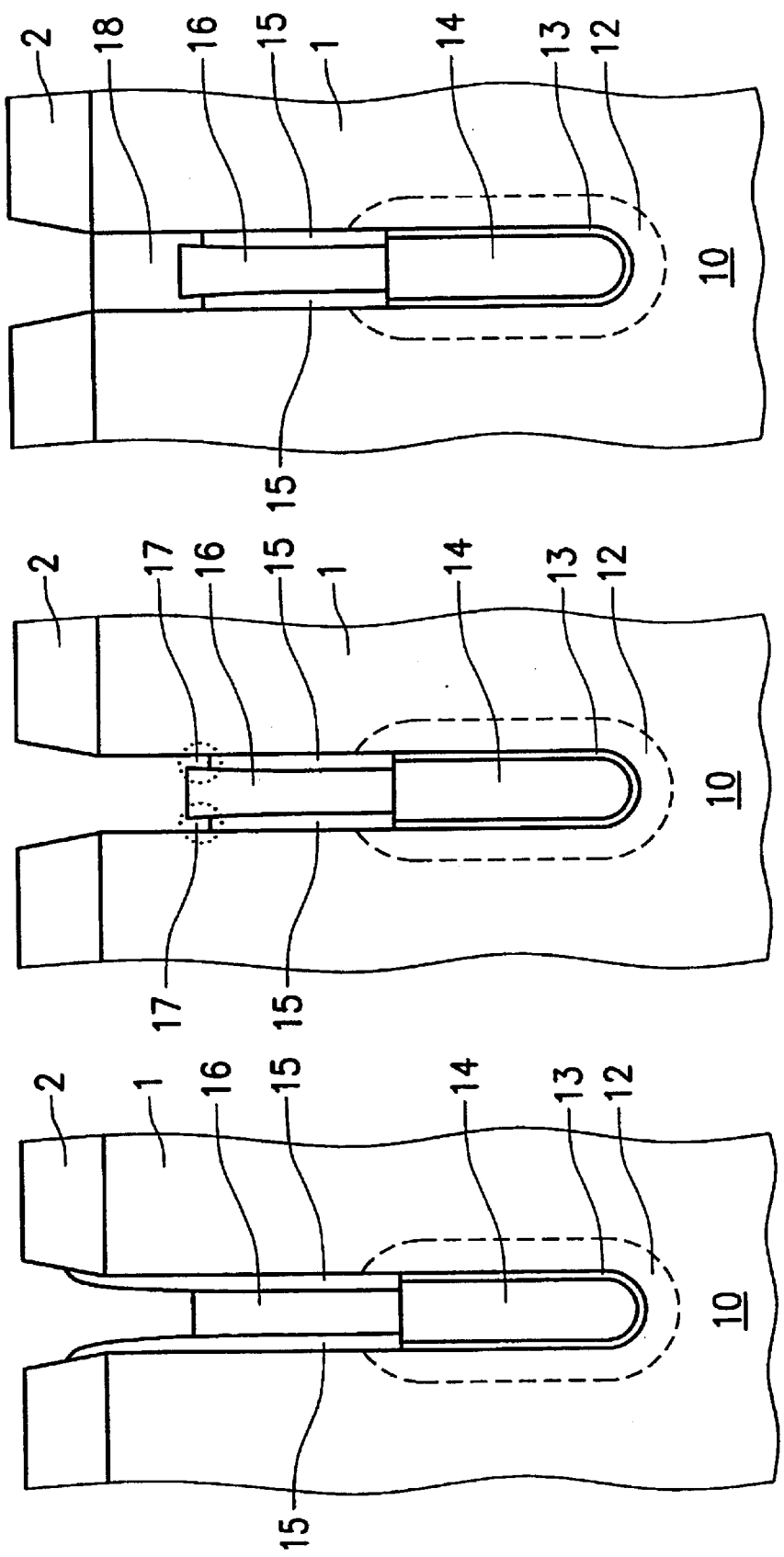
Figure 2:
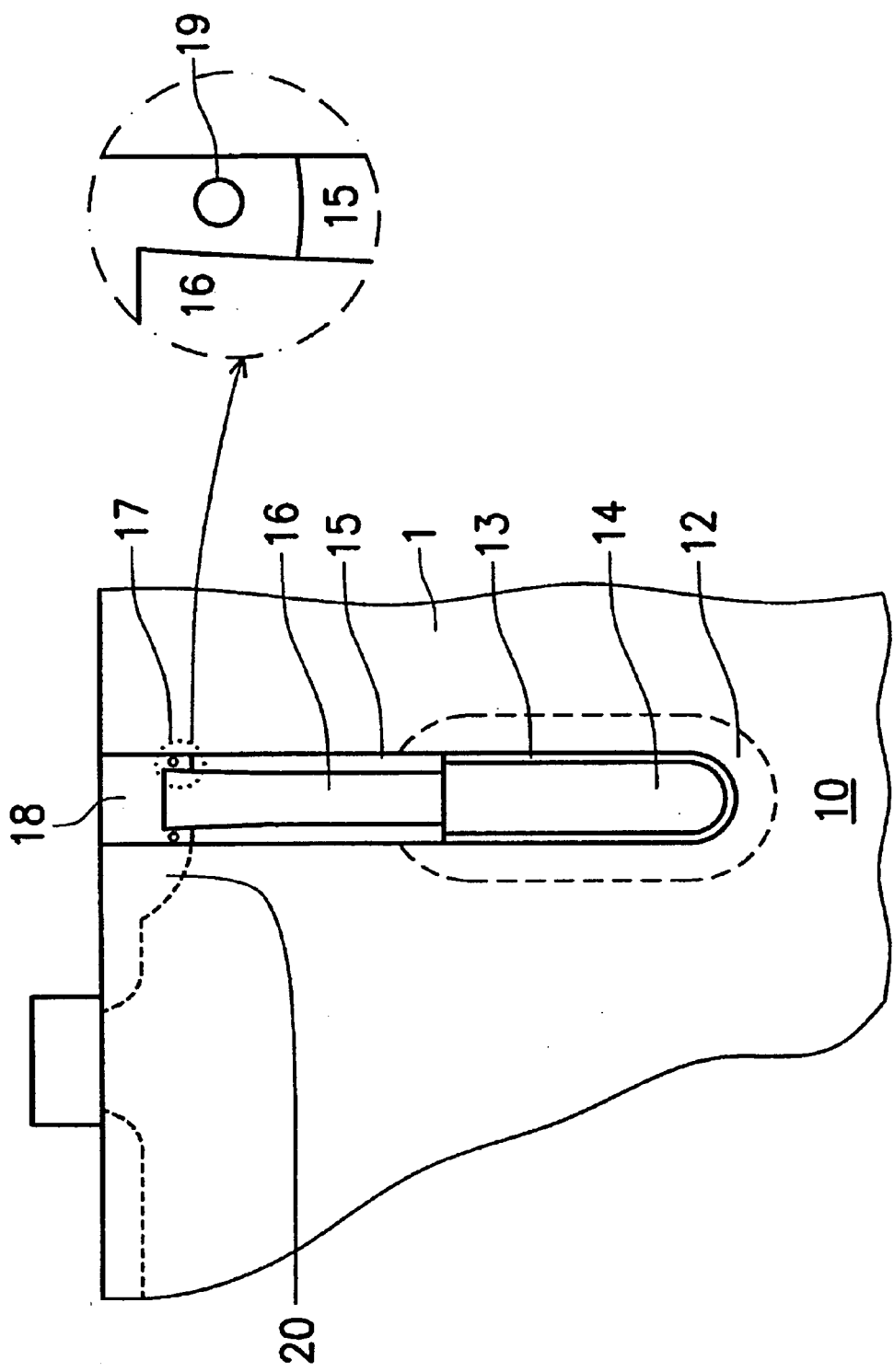
FIG. 2 shows that gaps 19 formed between the second polysilicon layer 16 and the collar insulating layer 15.

FIGS. 3A–3I show the embodiment of the present invention for manufacturing semiconductors with trench capacitors.

FIG. 3A shows the provision of a substrate 100 at the beginning of the semiconductor process. In the embodiment of the present invention, the substrate is lightly doped with P-type dopant, such as Boron (B). An oxide layer 104 is then formed, followed by a stop layer 105 and a hard mask layer 106, on the substrate 100. The hard mask layer 106 is used to define the location of the trench 101 formed by a reactive-ion-etching (RIE) step.

The hard mask layer 106 is removed after the formation of the trench 101 and a glass doping layer 151 is formed on the sidewall of the trench 101 as shown in FIG. 3B. Arsenic glass (ASG) or phosphorous glass (PSG) is used to perform the chemical vapor deposition (CVD) to form the glass doping layer 151 on the sidewall of the trench 101. The glass doping layer 151, having a thickness of about 2 nm–80 nm, is used to form a buried plate. A photoresistant material 152 is then deposited on the substrate 100 to fill up the trench 101.

Chemical dry etching (CDE) or reactive ion etching (RIE) is then performed to remove the photoresistant material 152 on the substrate 100 and in some part of the trench 101 as shown in FIG. 3C. Approximately 0.5 $\mu$m–2 $\mu$m of photoresistant material 152 is removed to define a collar region. The glass doping layer 151 in the collar region is then removed by wet etching.

Figure 3F:
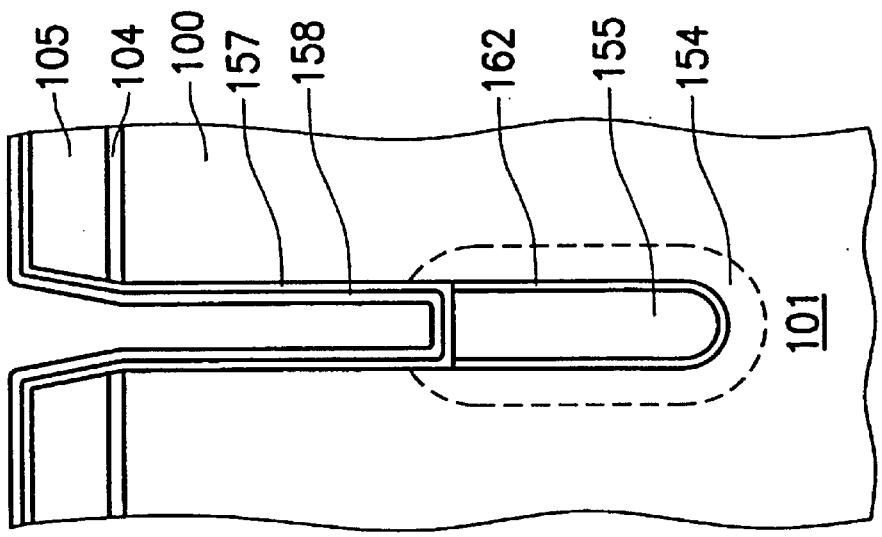
Figure 3E:
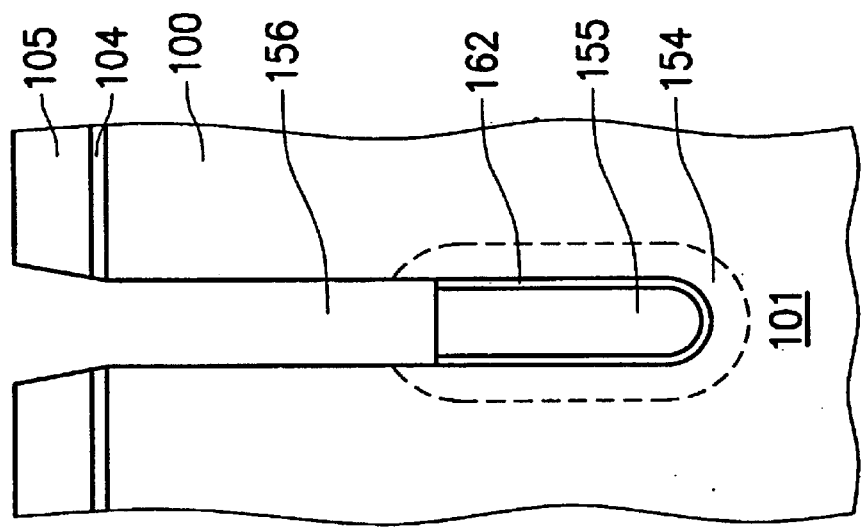
Figure 3D:
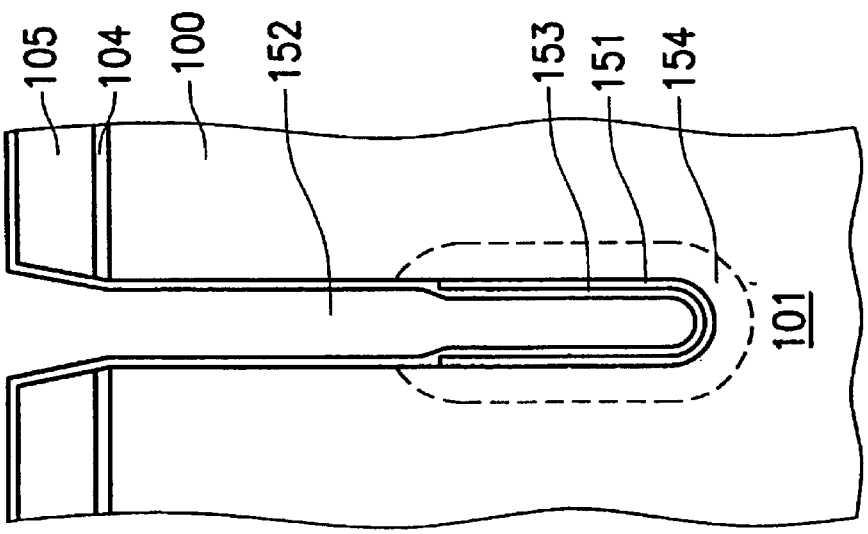

The remaining photoresistant material 152 in the trench 101 is wet etched as shown in FIG. 3D. After that, a first dielectric layer 153 of about 5 nm–30 nm is formed on the glass doping layer 151 in the trench 101 using silicon oxide by CVD. The dopant in the glass doping layer 151 outdiffuses to the substrate 101 to form a buried plate 154 after annealing with a temperature above 1050° C.

The glass doping layer 151 and the first dielectric layer 153 are removed by wet etching before a second dielectric layer 162 and a first conductive layer 155 are sequentially formed on the substrate, where the first conductive layer 155 fills up the trench 101. The first conductive layer 155 is a heavily doped polysilicon layer while the second dielectric layer is a nitride or oxinitride layer. The first conductive layer is removed from the substrate 100 and part of the trench 101 by chemical dry etching (CDE) or reactive ion etching (RIE), as shown in FIG. 3E. About 0.5 $\mu$m to 2 $\mu$m of the first conductive layer 155 is removed to define a collar region 156. The part of the second dielectric layer 162 not in contact with the first conductive layer 155 is removed by wet etching.

A U-shaped isolating collar 157 of about 20 nm to 40 nm is formed by chemical vapor deposition (VCD) using tetra ethyl oxysilane in the collar region 156 as shown in FIG. 3F. A second conductive layer 158 is subsequently formed on the insulating collar 157. The second conductive layer 158 is usually a polysilicon layer.

Figure 3I:
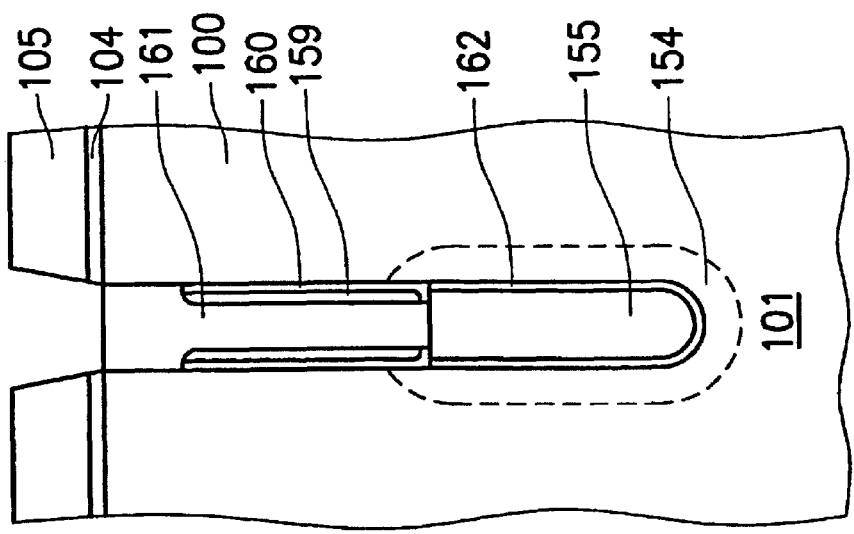
Figure 3H:
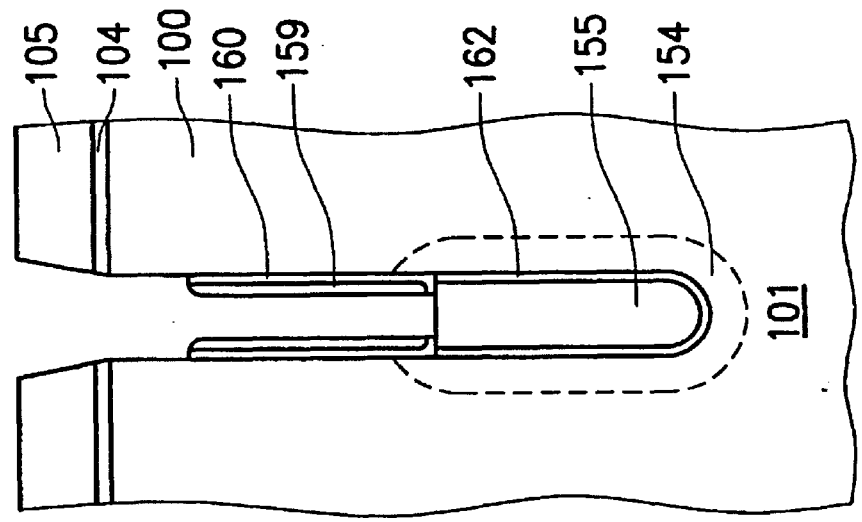
Figure 3G:
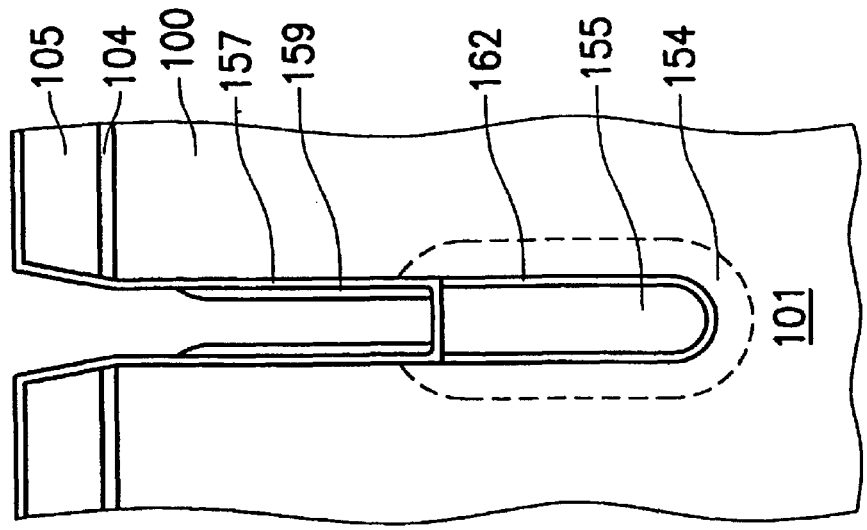

The two ends of the second conductive layer 158 close to and away from the open of the trench 101 are reactive-ion-etched to form a collar conductive layer 159 lower than the trench 101, as shown in FIG. 3G. The collar conductive layer 159 is optionally doped with n-type ion, such as phosphorous (P) or arsenic (As).

The insulating collar 157 not contacting the collar conductive layer 159 is wet etched to form a collar insulating layer 160 lower than the trench 101, as shown in FIG. 3H.

Finally, a buried strap 161 is formed in the collar region 156 as shown in FIG. 3I. The collar conductive layer 159 is optionally doped with n-type ion, such as P or As.

In the embodiment of the present invention, there is no gap between the collar conductive layer 159 and the collar insulating layer 160 as in the conventional technology, therefore, all the dopant in the first conductive layer 155 outdiffuses to the substrate through the buried strap 161. The buried strap 161 hence has a lower resistivity.

Components, such as metal oxidant NMOS or PMOS, coupled with the trench capacitor, are formed in some predetermined areas on the substrate 100. Lithography and anisotropic etching are performed to form a nonactive region 180, namely shallow insulating trench (STI) 180. The oxide layer 104 and the stopper 105 on the substrate 100 are then removed. An n-typed buried well 170 is formed in a predetermined depth of the substrate using a mask. The n-type buried well 170 can be formed by ion implantation using dopant such as P or As, where the buried plate 154 is partially in contact with the n-type buried well 170.

Figure 4:
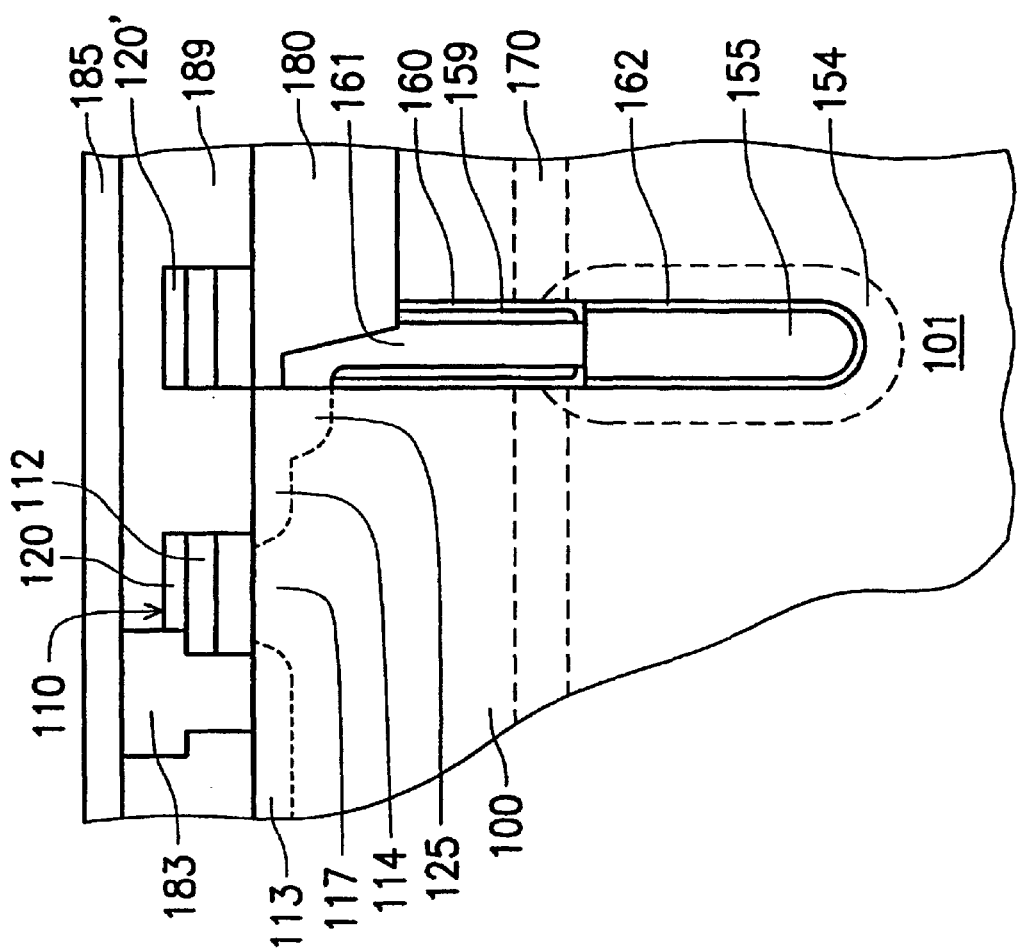
FIG. 4 represents the DRAM trench capacitor of the present invention.

The nonactive region 180 partially overlaps with the trench 101, as shown in FIG. 4. A transistor 110 is formed on the substrate 100. The transistor 110 comprises a gate 112, a word line 120 on the gate 112, the diffusion regions 113 and 114 beside the gate 112, and the tunnel region 117 under the gate 112. The diffusion region 114 couples to the trench capacitor through the coupling diffusion region 125 formed by diffusion of the first conductive layer 155 to the substrate 100. The other diffusion region 113 couples to a bitline 185 through a contact plug 183. An interposed dielectric intermediate layer 189 is covered on the substrate 100 and the transistor 110.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for manufacturing semiconductors with trench capacitors having a low-resistance buried strap, comprising the following steps:

providing a substrate;

forming a trench in the substrate;

forming a glass doping layer with a first predetermined depth at the bottom of the trench;

forming a first dielectric layer covering the glass doping layer in the trench;

diffusing dopants of the glass doping layer to the substrate by annealing to form a buried plate;

removing the first dielectric layer and the glass doping layer;

sequentially forming a second dielectric layer and a first conductive layer having depths approximately equal to the first predetermined depth in the trench, wherein the region above the first conductive region is defined as the collar region;

forming a U-shaped insulating layer in the collar region;

forming a collar conductive layer at the bottom of the U-shaped insulation layer in the collar region;

removing the U-shaped insulating layer not in contact with the collar conductive layer to form a collar insulating layer; and forming the buried strap in the trench.

2. The method in claim 1 further comprising forming a buried well electrically contacting the buried plate by ion implant in a predetermined depth of the substrate.

3. The method in claim 1 further comprising the following steps:

performing chemical vapor deposition with a glass dopant on the substrate and the trench;

forming a photoresistant layer on the substrate and the trench;

removing a predetermined depth of the photoresistant layer from the substrate and the trench by dry etching; and removing the predetermined depth of the glass dopant from the substrate and the trench by wet etching to form the dopant glass layer having the first predetermined depth at the bottom of the trench.

4. The method in claim 3 further comprising:

forming a second dielectric material on the substrate and the trench; and removing part of the dielectric material from the substrate and the trench by wet etching to form the second dielectric layer with the first predetermined depth at the bottom of the trench.

5. The method in claim 4 further comprising:

forming a first conductive material on the substrate and the trench; and removing part of the dielectric material from the substrate and the trench by chemical dry etching to form the first conductive layer with approximately the first predetermined depth at the bottom of the trench.

6. The method in claim 1 further comprising:

forming a U-shaped second conductive layer in contact with the U-shaped insulating layer in the upper part of the trench; and removing the ends of the second conductive layer close to and away from the open of the trench to form the collar conductive layer.

7. The method in claim 1, wherein the collar insulation layer comprises tetra ethyl oxysilane (TEOS).

8. The method in claim 1, wherein the first conductive layer comprises dopant.

9. The method in claim 1, wherein the depth of the collar insulation layer is approximately equal to that of the collar conductive layer.

10. The method in claim 1, wherein the depth of the collar insulation layer is lower than that of the collar conductive layer.

11. The method in claim 1, wherein the glass doping layer is doped with n-type dopants.

12. The method in claim 1, wherein the buried strap is on the first conductive layer and on the collar conductive layer.

* * * * *